United States Patent
Lee

(10) Patent No.: US 11,011,217 B1
(45) Date of Patent: May 18, 2021

(54) SELECTIVE EXTENSION OF A FINE GRANULARITY MODE FOR MEMORY REFRESH OPERATIONS

(71) Applicant: Micron Technology, Inc., Boise, ID (US)

(72) Inventor: Joosang Lee, Frisco, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/723,463

(22) Filed: Dec. 20, 2019

(51) Int. Cl.
   *G11C 7/22* (2006.01)
   *G11C 11/406* (2006.01)

(52) U.S. Cl.
   CPC ... *G11C 11/40618* (2013.01); *G11C 11/40611* (2013.01)

(58) Field of Classification Search
   CPC ......... G11C 11/40618; G11C 11/40611; G11C 11/406; G11C 11/4076; G11C 11/408; G11C 11/4091; G11C 2211/406; G11C 16/3431
   See application file for complete search history.

(56) References Cited

U.S. PATENT DOCUMENTS

| | | | |
|---|---|---|---|
| 7,330,391 B2 * | 2/2008 | Freebern | G11C 8/12 365/189.04 |
| 9,058,894 B2 * | 6/2015 | Kardach | G11C 11/40618 |
| 10,061,541 B1 | 8/2018 | Lee | |
| 10,297,307 B1 * | 5/2019 | Raad | G11C 11/1675 |
| 2013/0254475 A1 * | 9/2013 | Perego | G11C 11/406 711/106 |
| 2019/0324689 A1 * | 10/2019 | Choi | G06F 3/064 |

* cited by examiner

*Primary Examiner* — Hien N Nguyen
(74) *Attorney, Agent, or Firm* — Fletcher Yoder, P.C.

(57) ABSTRACT

Control circuitry may operate to refresh memory banks and determine that a memory bank was not refreshed within a threshold time duration from the current time. The control circuitry may extend a duration of an operational mode in response to determining that the memory bank was not refreshed within the threshold time duration. In response to extending the duration of the operational mode, the control circuitry may refresh the second memory bank without refreshing the first memory bank.

20 Claims, 11 Drawing Sheets

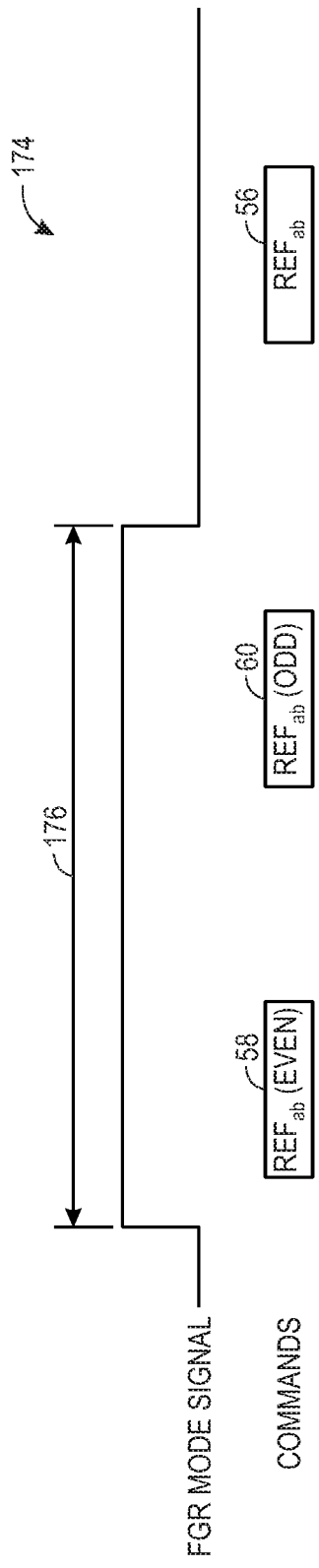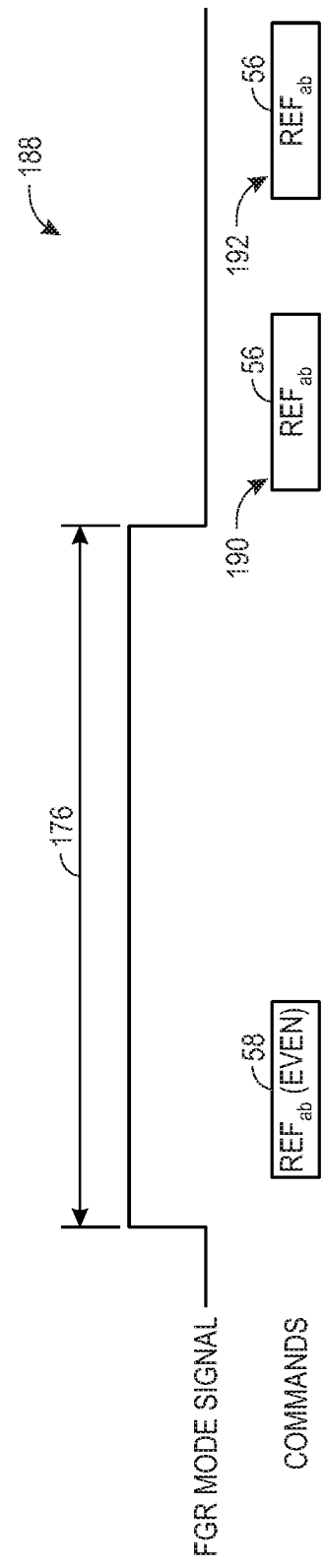

US 11,011,217 B1

SELECTIVE EXTENSION OF A FINE GRANULARITY MODE FOR MEMORY REFRESH OPERATIONS

BACKGROUND

The present disclosure relates generally to memory devices and, more particularly, to memory refresh operations for preserving data stored in the memory devices.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system includes processing circuitry, such as one or more processors or other suitable components, and memory devices, such as chips or integrated circuits. One or more memory devices may be implemented on a memory module as part of a memory array, such as a dynamic random-access memory (DRAM) device employed on a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include instructions executable by the processing circuitry to perform an operation and/or may include data to be used as an input for the operation. In addition, in some cases, data output from the operation may be stored in memory, for example, to enable subsequent retrieval. These memory devices may include storage circuitry that is to be periodically refreshed via memory refresh operations (e.g., refreshing operations) to maintain data stored via the memory devices. However, the refresh operations may consume undesired amounts of power.

BRIEF DESCRIPTION OF THE DRAWINGS

Various aspects of this disclosure may better be understood upon reading the following detailed description and upon reference to the drawings in which:

FIG. 7 is a timing diagram of an example refresh command schedule followed by the memory device of FIG. 1, according to an embodiment of the present disclosure;

FIG. 8 is a timing diagram of a second example refresh command schedule followed by the memory device of FIG. 1, according to an embodiment of the present disclosure;

DETAILED DESCRIPTION

Figure 1:
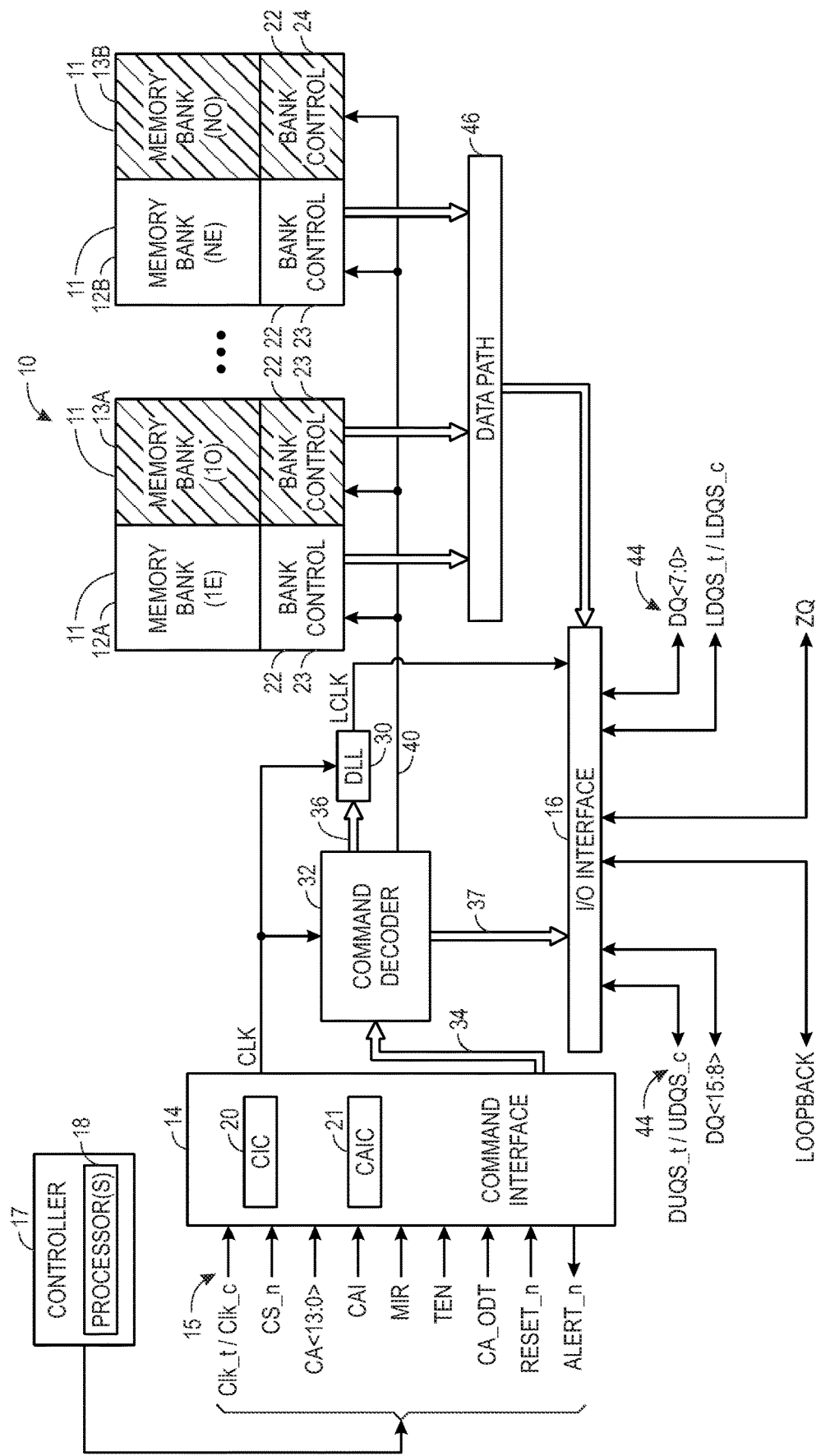
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

A computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor. Different types of memory, however, may be periodically or occasionally refreshed to suitably retain information within the memory.

For example, a dynamic random-access memory (DRAM) device, or another type of volatile semiconductor memory device, may lose information stored within its memory circuitry over time. To counteract degradation of the information stored within the memory circuitry over time, the DRAM device may be refreshed as part of a memory refresh operation. During the memory refresh operation, portions of the DRAM device (e.g., memory banks) are read and rewritten as a way to refresh (e.g., restore) electrical signals representing the information stored within the memory circuitry.

Like many operations within an electronic device, a memory refresh operation may be initiated by a controller of the electronic device and managed by subsequent logic circuitry that generates additional control signals in response to an initiation of the memory refresh operation. The memory devices may include memory banks, and groups of memory banks may couple to memory bank logic circuitry that generates the additional control signals to perform the memory refresh operation. Furthermore, a memory controller may refresh a DRAM device while in a fine granularity refresh mode (FGR mode).

While in the FGR mode, a memory controller responsible at least in part for refreshing of memory banks of the DRAM device may transmit refresh commands to instruct refreshing of memory banks at a variety of granularities. For example, the memory controller may transmit a refresh command to refresh all memory banks ($REF_{ab}$) of the DRAM device when operating in a normal operational mode (e.g., normal mode, not FGR mode), but sometimes the memory controller may transmit two refresh commands to refresh (e.g., two $REF_{ab}$ commands) to achieve a same effect in the $REF_{ab}$ 1× mode when operating in the FGR mode. Furthermore, in some cases, the refresh operation granularity may increase to include commanding of individual banks of the DRAM device (e.g., $REF_{ab}$(FGRmode)=$REF_{sb}$(0), $REF_{sb}$(1), $REF_{sb}$(2), $REF_{sb}$(3)). It is generally recommended to have an even number of all bank refresh operations (e.g., $REF_{ab}$ commands) while operating in an FGR mode. When an operation of the memory controller causes a non-even number of all bank refresh operations to be performed (e.g., a non-even number of $REF_{ab}$ commands, an odd number of $REF_{ab}$ commands) in the FGR mode, the memory controller may perform an additional all bank refresh operation on the banks (e.g., an additional $REF_{ab}$ command). While operating in a normal mode (e.g., not the FGR mode), the memory controller may refresh all of the memory banks using the $REF_{ab}$ command and be unable to refresh a selectable number of banks, as permitted while in the FGR mode. Since some of the memory banks were refreshed before the memory controller exited the FGR mode, it may be redundant to refresh all of the memory banks to compensate for the portion of the memory banks not refreshed. Redundant refreshing operations may increase power consumption of the DRAM device. Thus, power consumption of the DRAM device, and therefore power consumption of the electronic device, may be reduced if these redundant refresh operations are reduced or eliminated.

Since the DRAM device performs these redundant refresh operations in response to a premature exit from the FGR mode, operating the DRAM device to consider an even number of refresh operations (e.g., even number of $REF_{ab}$ commands, even number of $REF_{sb}$(0), $REF_{sb}$(1), $REF_{sb}$(2), and $REF_{sb}$(3) commands) before exiting the FGR mode may improve operation of the DRAM device (e.g., reduce power consumption). Operation may improve since the DRAM device may internally extend a duration of the FGR mode in response to receiving the command to exit the FGR mode. Extending the FGR mode may permit the DRAM device time to finish refreshing any remaining portions of memory desired to be refreshed before exiting the FGR mode. For example, in response to the memory controller instructing an exit from the FGR mode, the DRAM device may internally extend the FGR mode (e.g., without dependence on instruction from the memory controller) to provide time to complete any incomplete or uneven refreshing operations. In some cases, the FGR mode may be extended by a suitable amount of time to be used to complete any remaining refresh operations (e.g., the amount of time by which the FGR mode is extended may be variable between extensions and based on an amount of remaining refresh operations). When each memory portion of memory is refreshed before exiting from the FGR mode and/or when an even number of all bank refresh commands are executed, the additional refresh operation is not applied to already refreshed memory portions, thereby providing a reduction in power consumption of the DRAM device.

Turning now to the figures, FIG. 1 is a simplified block diagram illustrating certain features of a semiconductor device (e.g., a memory device 10). In accordance with one embodiment, the memory device 10 may be a double data rate type five synchronous dynamic random access memory (DDR5 SDRAM) device. Various features of DDR5 SDRAM permit reduced power consumption of a memory, where the memory may have more bandwidth and more storage capacity compared to prior generations of DDR SDRAM. While the present disclosure uses the memory device 10 as an example, it should be understood that embodiments of the present disclosure are envisioned to apply to any suitable semiconductor device, such as integrated circuits, transistors, processors, microprocessors, and the like.

The memory device 10, may include a number of memory banks 11. In some embodiments, the memory banks 11 include DDR5 SDRAM memory banks. The memory banks 11 may be provided on one or more chips (e.g., SDRAM chips) arranged on one or more dual inline memory modules (DIMMS). In this way, each DIMM may include a number of SDRAM memory chips (e.g., ×8 or ×16 memory chips). Each SDRAM memory chip may include one or more memory banks 11. The memory device 10 represents a portion of a single memory chip (e.g., SDRAM chip) having a number (2*N) of memory banks 11. It is noted that the depicted example illustrates an arrangement for an 8 gigabit (Gb) SDRAM. When the memory device includes a 16 Gb SDRAM, the memory device may include 4×N number of memory banks 11. The memory banks 11 may be further arranged to form bank groups. For instance, for an 8 Gb SDRAM, the memory chip may include 16 memory banks 11, arranged into 8 bank groups, each bank group including 2 memory banks. For a 16 Gb SDRAM, the memory chip may include 32 memory banks 11, arranged into 8 bank groups, each bank group including 4 memory banks, for instance. Various other configurations, organization and sizes of the memory banks 11 on the memory device 10 may be utilized depending on the application and design of the overall system. Using an 8 Gb SDRAM as an example, the memory banks 11 may be divided into sets of memory banks 11, such as a number (N) of even memory banks 12 and a number (N) of odd memory banks 13. In this way, in 8 Gb SDRAM, there may be two banks per bank group. It is noted that four banks may be assigned to one bank group in 16 Gb SDRAM technologies. It should be understood that references in the present disclosure to the even memory banks 12 should apply equally to the odd memory banks 13, and vice versa.

Sometimes memory banks are associated into pairs of memory banks 11. For example, memory bank 12A may be paired in a memory bank pair with the memory bank 13A. In this way, some memory operations may be desired to be performed on memory bank pairs evenly or symmetrically. For example, some refresh operations may be considered incomplete if the memory bank 12A is refreshed without also refreshing the memory bank 12B.

The memory device 10 may include a command interface 14 and an input/output (I/O) interface 16. The command interface 14 may include processing and/or interface circuitry configured to provide a number of signals (e.g., signals 15) from an external device, such as a controller 17. The controller 17 may include processing circuitry, such as one or more processors 18 (e.g., one or more microprocessors), that execute software programs to provide various signals 15 to the memory device 10 to facilitate the transmission and/or receipt of data to be written to or read from the memory device 10. Moreover, the processors 18 may include multiple microprocessors, one or more "general-purpose" microprocessors, one or more special-purpose microprocessors, and/or one or more application specific integrated circuits (ASICs), or some combination thereof. For example, the processors 18 may include one or more reduced instruction set (RISC) processors.

The memory device 10 may be apart of a larger memory system. The memory system and/or the memory device 10 may store information such as control logic and/or software, look up tables, configuration data, or the like, that the processor 18, and thus the controller 17, uses to retrieve or store data associated with performing operations, or the like. In some embodiments, the processors 18 and/or the memory system may be external to the controller 17, however sometimes the processors and the memory system may be internal to the controller and/or in a same packaging as the controller 17. The memory system may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory system may store a variety of information used for various purposes. For example, the memory system may store machine-readable and/or processor-executable instructions (e.g., firmware or software) for the processors 18 to execute, such as instructions for providing various signals 15 to the memory device 10 to facilitate the transmission and receipt of data to be written to or read from the memory device 10 and/or to facilitate refresh operations. As such, the controller 17 may provide various signals 15 to the memory device 10 to facilitate the transmission and receipt of data to be written to or read from the memory device 10.

As will be appreciated, the command interface 14 may include a number of circuits, such as a clock input circuit 20 and a command address input circuit 21, for instance, to handle the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t/ and the rising of the complementary clock signal Clk_c. Commands (e.g., read command, write command, refresh command) are typically entered on the positive edges of the clock signal and data is transmitted or received on both the positive and negative clock edges.

The I/O interface 16 may include processing and/or interface circuitry. The I/O interface 16 may use the processing and/or interface circuitry when managing and/or performing input/output operations between the memory device 10 and any suitable external device coupled to the I/O interface 16.

The clock input circuit 20 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The command decoder 32 may also provide command signals to the I/O interface 16 over bus 37 to facilitate receiving and transmitting I/O signals. The phase controlled internal clock signal LCLK may be used to clock data through the I/O interface 16, for instance.

Further, the command decoder 32 may decode commands, such as read commands, write commands, mode-register set commands, activate commands, refresh commands, or the like, and provide access to a particular memory bank 11 corresponding to the command, via a path 40. As will be appreciated, the memory device 10 may include various other decoders, such as row decoders and column decoders, to facilitate access to the memory banks 11. In one embodiment, each memory bank 11 includes a bank control block 22 which provides the necessary decoding (e.g., row decoder and column decoder), as well as other features, such as timing control and data control, to facilitate the execution of commands to and from the memory banks 11. In particular, the path 40 may include a row address path that may provide a row address (e.g., sent from the command decoder 32 or one or more counters coupled to the row address path) to the bank control blocks 22 so that the bank control blocks 22 may perform operations on a row corresponding to the row address. The path 40 may be shared by both the command decoder 32 sending a row address on the path 40 to be activated, as well as the counters sending a row address on the path 40 to be refreshed. Similar to the memory banks 11, the bank control blocks 22 may also be divided into sets of bank control blocks 22, such as even bank control blocks 23 associated with the even memory banks 12 and odd bank control blocks 24 associated with the odd memory banks 13. It should be understood that references in the present disclosure to the even bank control blocks 23 should apply equally to the odd bank control blocks 24, and vice versa.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 21 which is configured to receive and transmit the commands to provide access to the memory banks 11, through the command decoder 32, for instance. In addition, the command interface 14 may receive a chip select signal (CS_n). The CS_n signal enables the memory device 10 to process commands on the incoming CA<13:0> bus. Access to specific banks 11 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 11 over the data path 46, which may include multiple data paths or bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor 18 or memory controller 17 sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the I/O pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), and the like, may also be incorporated into the memory device 10. Accordingly, it should be understood that the block diagram of FIG. 1 is only provided to highlight certain functional features of the memory device 10 to aid in the subsequent detailed description.

Figure 2:
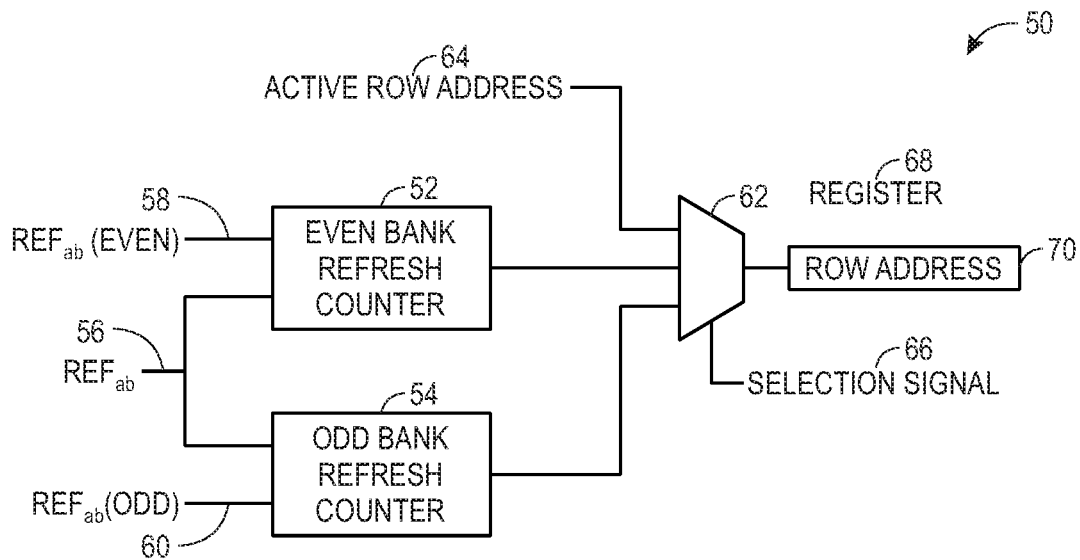
FIG. 2 is a schematic diagram of a row address output circuit of a command address input circuit of the memory device of FIG. 1, according to an embodiment of the present disclosure.

With the foregoing in mind, FIG. 2 is a schematic diagram of a row address output circuit 50 of the command address input circuit 21 of the memory device 10 of FIG. 1. As illustrated, the row address output circuit 50 includes an even bank refresh counter 52 and an odd bank refresh counter 54. It should be understood that references to the even bank refresh counter 52 in the present disclosure may apply equally to the odd bank refresh counter 54, and vice versa.

The even bank refresh counter 52 may store a row address associated with a set of memory banks 11 to be refreshed according to a first refresh operational phase (e.g., an even phase), such as by using refresh operations and/or control signals specific to the first refresh operational phase of refreshing, for example, voltage signals of different amplitudes (e.g., relative higher voltages) or phases relative to signals used during a second refresh operational phase (e.g., odd phase). For ease of discussion, the first refresh operational phase is referred to as an "even phase" and the second refresh operational phase is referred to as an "odd phase." The even bank refresh counter 52 may increment the stored row address when the row address output circuit 50 receives a $REF_{ab}$ (refresh all memory banks) command 56 or a $REF_{ab}$(Even) (refresh memory banks—even phase) command 58. The $REF_{ab}$ command 56 may be transmitted (e.g., by the command interface 14, the external memory controller 17, or the like) to refresh all memory banks 11, while the $REF_{ab}$(Even) command 58 may be transmitted to each bank control block 22 of the associated set of memory banks 11. In either case, in response to receiving the $REF_{ab}$ command 56 or the $REF_{ab}$(Even) command 58, associated bank control blocks 22 may refresh the row address identified by the even bank refresh counter 52 of a respective memory bank 11 (e.g., corresponding to the bank control blocks 22).

Similarly, the odd bank refresh counter 54 may store a row address associated with the set of memory banks 11 to be refreshed according to an odd phase. The odd bank refresh counter 54 may increment the stored row address when the row address output circuit 50 receives a $REF_{ab}$ (refresh all memory banks) command 56 or a $REF_{ab}$(Odd) (refresh memory banks—odd phase) command 60. The $REF_{ab}$(Odd) command 60 may be transmitted to each associated bank control block 22 to refresh the memory banks 11 according to the odd phase, such as by using refresh operations and/or control signals specific to a second operational phase of refreshing, for example, voltage signals of different amplitudes or phases relative to signals used during the even phase (e.g., relative lower voltages). In either case, in response to receiving the $REF_{ab}$ command 56 or the $REF_{ab}$(Odd) command 60, each associated bank control block 22 may refresh the row address identified by the odd bank refresh counter 54 of a respective memory bank 11 (e.g., corresponding to the bank control blocks 22).

It is noted that the even bank refresh counter 52 may not be dedicated to the even memory banks 12 and/or the odd bank refresh counter 54 may not be dedicated to the odd memory banks 13. That is, the even bank refresh counter 52 and the odd bank refresh counter 54 may be interchanged independent of the contents and/or relative positioning of the even memory banks 12 and/or the odd memory banks 13.

A multiplexer 62 of the row address output circuit 50 may accept the row address stored in the even bank refresh counter 52, the row address stored in the odd bank refresh counter 54, and an activate row address 64 (e.g., associated with a read or write operation) as inputs. The multiplexer 62 may output one of these inputs based on a selection signal 66. The selection signal 66 may indicate whether the command sent to the row address output circuit 50 is, for example, the $REF_{ab}$ command 56, the $REF_{ab}$(Even) command 58, the $REF_{ab}$(Odd) command 60, an activate command, or the like. The multiplexer 62 may then output the row address stored in the even bank refresh counter 52, the row address stored in the odd bank refresh counter 54, or the activate row address 64 to a register 68 that stores the output as row address 70. The row address 70 may then be captured (e.g., by bank control blocks 22) to perform refresh and/or access (e.g., read/write) operations in the even memory banks 12, the odd memory banks 13, or both.

The bank control blocks 22 may perform any suitable number of refresh operations on any suitable number of rows of respective memory banks 11 (e.g., corresponding to the bank control blocks 22) per refresh command. For example, if the memory device 10 is operating in an FGR (Fine Granularity Refresh) 2× mode, a single refresh command may refresh one or more rows of a memory bank 11. If the memory device is operating in an FGR 1× mode, a single refresh command may perform two refresh operations on two sets of rows of a memory bank 11.

Figure 3:
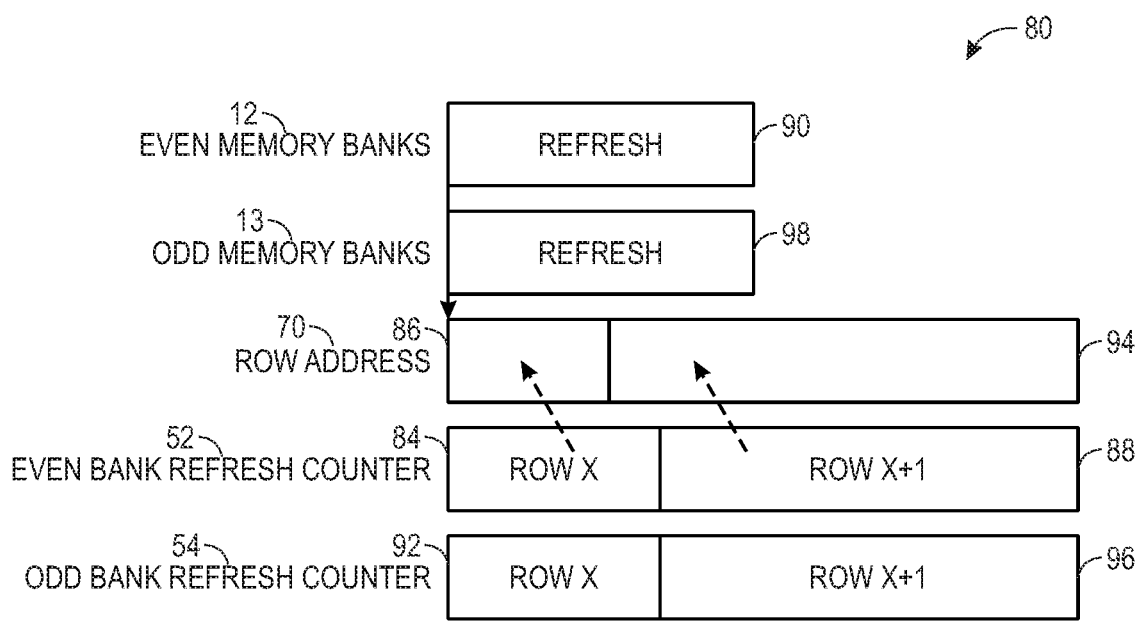
FIG. 3 is an example timing diagram illustrating bank control blocks performing a command that performs one refresh operation on one or more rows of all memory banks of the memory device of FIG. 1 using a shared address path, according to an embodiment of the present disclosure.

FIG. 3 is an example timing diagram 80 illustrating the bank control blocks 22 performing the $REF_{ab}$ command 56 that performs one refresh operation on one or more rows of all memory banks 11 of the memory device 10 of FIG. 1 using a shared address path 40. In response to receiving the $REF_{ab}$ command 56 (e.g., at the command decoder 32), the even bank control blocks 23 may refresh the even memory banks 12 while (e.g., simultaneously) the odd bank control blocks 24 refresh the odd memory banks 13. Because the even memory banks 12 and the odd memory banks 13 are refreshed during the $REF_{ab}$ command 56, no memory banks 11 of the memory device 10 may be activated (e.g., as part of read or write operations).

For example, in response to receiving the $REF_{ab}$ command 56, the row address output circuit 50 may output the row address (i.e., Row X 84) in the even bank refresh counter 52 on the path 40 to store in the register 68 as the row address 70 (i.e., as shown in portion 86) to perform a refresh operation. Both the even bank refresh counter 52 and the odd bank refresh counter 54 may then increment the stored row address (i.e., from Row X 84, 92 to Row X+1 88, 96) to account for Row X 84 of the even memory banks 12 and the odd memory banks 13 being refreshed. The even bank control blocks 23 and the odd bank control blocks 24 may capture the row address 70 (i.e., Row X 84) and refresh 90, 98 the row address 70 in the even memory banks 12 and the odd memory banks 13. Both the even bank refresh counter 52 and the odd bank refresh counter 54 may increment the stored row address (i.e., from Row X 84, 92 to Row X+1 88, 96) to account for Row X 92 of the even memory banks 12 and the odd memory banks 13 being refreshed.

While the example described in the timing diagram 80 of FIG. 3 illustrates one row (e.g., Row X 84) of the even memory banks 12 and the odd memory banks 13 being refreshed, it should be understood that multiple rows of the even memory banks 12 and the odd memory banks 13 may instead or also be refreshed. In this manner, the bank control blocks 22 may refresh one or more rows of all memory banks 11 of the memory device 10 of FIG. 1 in response to each $REF_{ab}$ command 56 performing one refresh operation.

Figure 4:
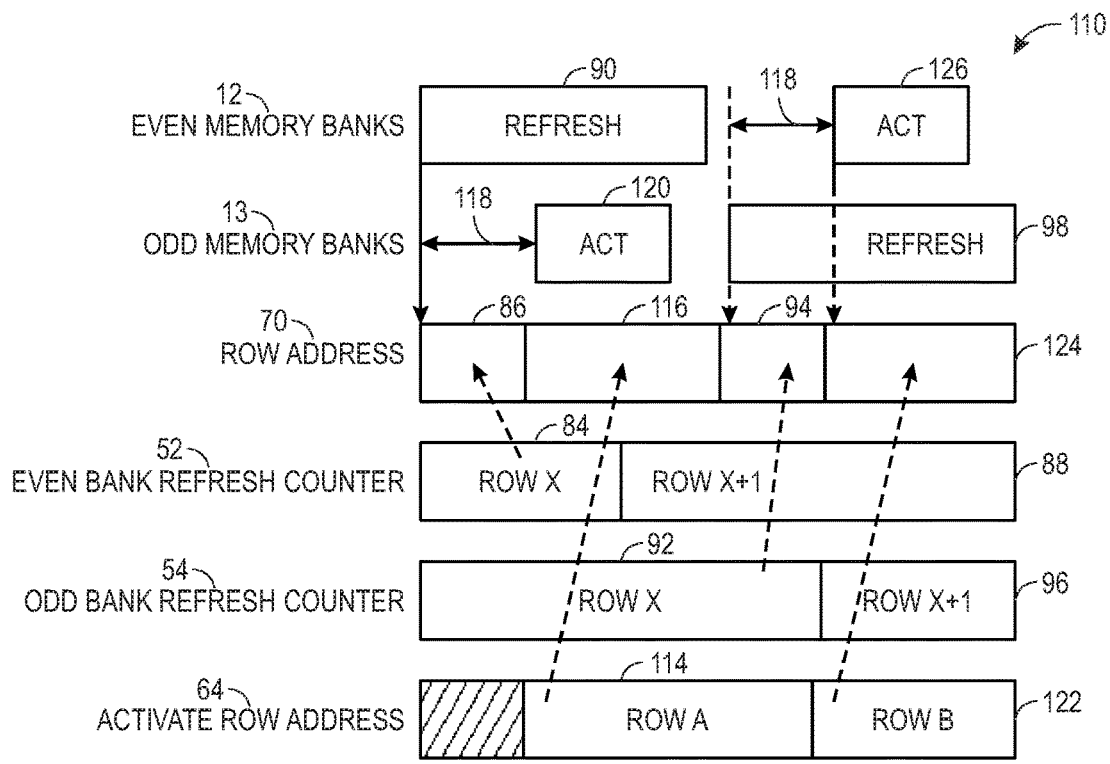
FIG. 4 is an example timing diagram illustrating bank control blocks performing a command that performs one refresh operation on one or more rows of a set (e.g., even or odd) of memory banks of the memory device of FIG. 1 using a shared address path, according to an embodiment of the present disclosure.

FIG. 4 is an example timing diagram 110 illustrating the bank control blocks 22 performing the $REF_{ab}$ commands 58, 60 by performing one refresh operation on one or more rows of a set of memory banks 11 of the memory device 10 of FIG. 1 using the path 40. In response to receiving the $REF_{ab}$(Even) command 58 (e.g., at the command decoder 32), the bank control blocks 22 may refresh each memory bank 11 according to an even phase (e.g., using even phase or first operational phase control signals). Similarly, in response to receiving the $REF_{ab}$(Odd) command 60 (e.g., at the command decoder 32), the bank control blocks 22 may refresh the memory banks 11 according to an odd phase (e.g., using odd phase or second operational phase control signals).

For example, in response to receiving the $REF_{ab}$(Even) command 58, the row address output circuit 50 may output the row address (i.e., Row X 84) in the even bank refresh counter 52 to store in the register 68 as the row address 70 (i.e., as shown in portion 86) to be captured to perform a refresh operation. The even bank refresh counter 52 may then increment the stored row address (i.e., from Row X 84 to Row X+1 88). The bank control blocks 22 may capture the row address 70 (i.e., Row X 84) and refresh 90 the row address 70 in the memory banks 11 using even phase control signals.

In some cases, the memory controller 17 may operate in an FGR mode that enables subsets of memory banks 11 (e.g., even memory banks 12, odd memory banks 13) to be refreshed while other subsets of memory banks 11 are accessed. For example, while the refresh operation 90 is performed on the even memory banks 12 via one or more $REF_{sb}$ commands, the odd memory banks 13 may be activated (e.g., for read/write operations). In this example, in response to receiving an activate (ACT) command (e.g., at the command decoder 32), and when the register 68 is available to store a new row address 70 (e.g., such as in between refresh operations), the row address output circuit 50 may output an activate row address 64 (i.e., Row A 114) of the odd memory banks 13 to store in the register 68 as the row address 70 (i.e., as shown in portion 116) to be captured to perform an access (e.g., read/write) operation. After a delay 118 (e.g., $t_{RRD}$) associated with a delay between (consecutive) activations, one or more odd bank control blocks 24 may activate 120 the row address 70 (i.e., Row A 114) of one or more odd memory banks 13 to, for example, read from or write to the row address 70. In some embodiments, multiple activate commands may be received and multiple activations 120 may be performed while the refresh operation 90 is performed on the even memory banks 12 via the $REF_{sb}$ command (e.g., depending on the delay 118, the time it takes to perform the activation 120, and the time it takes to perform the refresh operation 90). Similar operations may be performed to enable access to the even memory banks 12 while the odd memory banks 13 are refreshed. For example, in response to receiving the activate command (e.g., at the command decoder 32), and when the register 68 is available to store a new row address 70, the row address output circuit 50 may output an activate row address 64 (i.e., Row B 122) of the even memory banks 12 to store in the register 68 as the row address 70 (i.e., as shown in portion 124) to be captured to perform an access (e.g., read/write) operation.

In response to receiving the $REF_{ab}$(Odd) command 60, and when the register 68 is available to store a new row address 70, the row address output circuit 50 may also output the row address (i.e., Row X 92) in the odd bank refresh counter 54 to store in the register 68 as the row address 70 (i.e., as shown in portion 94) to be captured to perform a refresh operation. The odd bank refresh counter 54 may then increment the stored row address (i.e., from Row X 92 to Row X+1 96). The odd bank control blocks 24 may capture the row address 70 (i.e., Row X 92) and refresh 98 the row address 70 in the memory banks 11.

While this example describes one row (e.g., Row X 84) of the memory banks 11 being refreshed, it should be understood that multiple rows of the even memory banks 12 and the odd memory banks 13 may instead or also be refreshed. In this manner, the bank control blocks 22 may refresh one or more rows of a set (e.g., even or odd) memory banks 11 in response to each $REF_{ab}$ command 58, 60.

Figure 5:
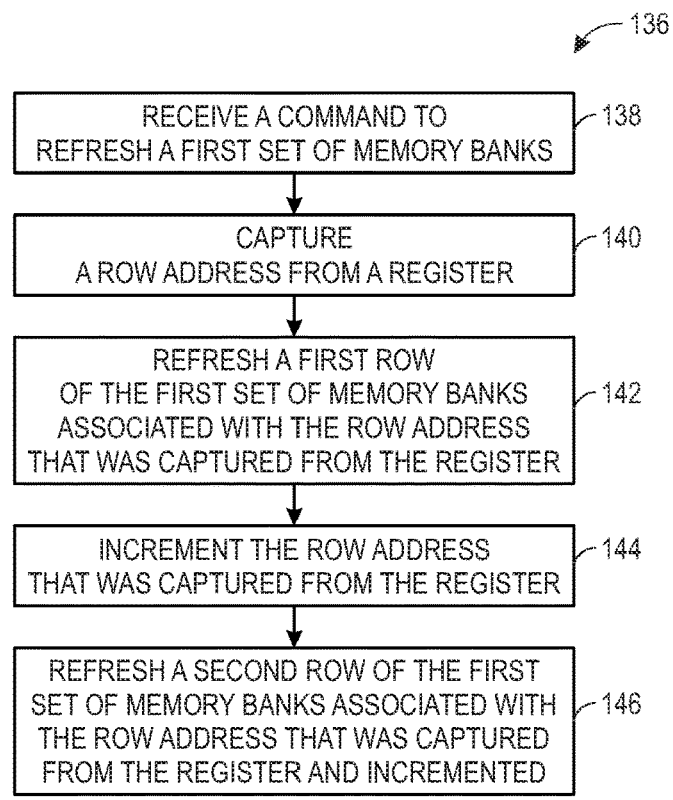
FIG. 5 is a flow diagram of a method for refreshing a first set of memory banks of the memory device of FIG. 1 while activating a row of a second set of the memory banks using a shared address path, according to an embodiment of the present disclosure.

To help elaborate on refresh operations, FIG. 5 is a flow diagram of an example method 136 for refreshing a first set of memory banks 11 of the memory device 10 while activating a row of a second set of the memory banks 11, such as during an FGR mode. The method 136 may be performed by one or more suitable devices that capture a row address from a register (e.g., 68), increment the row address captured from the register, and refresh rows of the memory banks 11. While the method 136 is described using steps in a specific sequence, it should be understood that the present disclosure contemplates that the described steps may be performed in different sequences than the sequence illustrated, and certain described steps may be skipped or not performed altogether. In some embodiments, at least some of the steps of the method 136 may be performed by bank control blocks 22 of the memory device 10, as described below.

As illustrated, the bank control blocks 22 may receive (process block 138) a command to refresh a first set (e.g., the even memory banks 12, the odd memory banks 13) of memory banks 11. For example, the command may be the $REF_{sb}$ command used to refresh a portion of memory banks according to an even phase or an odd phase.

The bank control blocks 22 associated with the first set of memory banks 11 may capture (process block 140) a row address 70 from a register 68 of the memory device 10. The register 68 may store an output of the multiplexer 62 of the row address output circuit 50. As such, the register 68 may store the row address stored in the even bank refresh counter 52, the row address stored in the odd bank refresh counter 54, or the activate row address 64.

The bank control blocks 22 associated with the first set of memory banks 11 may refresh (process block 142) a first row of the first set of memory banks 11 associated with the row address 70 that was captured from the register 68. In particular, the first row of the first set of memory banks 11 may have an address that is the same as the row address 70 that was captured from the register 68.

The bank control blocks associated with the first set of memory banks 11 may increment (process block 144) the row address 70 that was captured from the register 68. The row address 70 may be incremented internally, such that the row address 70 is stored and incremented in a memory device (e.g., a register) local to the bank control blocks 22. In particular, the row addresses stored in the even bank refresh counter 52 and the odd bank refresh counter 54 may not change when the row address 70 is incremented. However, the even bank refresh counter 52 or the odd bank refresh counter 54 may increment respectively stored row addresses to account for the internally incremented row address 70.

The bank control blocks associated with the first set of memory banks 11 may refresh (process block 146) a second row of the first set of memory banks 11 associated with the row address 70 that was captured from the register 68 and incremented. In particular, the second row of the first set of memory banks 11 may have an address that is the same as the row address 70 that was captured from the register 68 and incremented. In this manner, the bank control blocks 22 may refresh a first set of memory banks 11 while activating a row of a second set of memory banks 11, and prevent a wrong row of the first set of memory banks 11 from being refreshed and/or a wrong row of the second set of memory banks 11 from being activated. Commonly-assigned U.S. Pat. No. 10,061,541B1 may provide additional information on at least partially simultaneous refreshing operations and activating operations of an 8 Gb SDRAM device (e.g., $REF_{sb}$ command operations for 8 Gb SDRAM device systems), which is hereby incorporated by reference herein in its entirety.

Keeping the foregoing in mind, as described above, the memory controller 17 may sometimes operate in a FGR mode. It is noted that the memory controller 17 is described herein for sake of discussion, but in some embodiments the operations described as performed by the memory controller 17 may be performed by other suitable processing circuitry. In the FGR mode, the memory controller 17 may refresh the memory banks 11 at relatively more defined granularities. For example, the refresh operation granularity may increase to include commanding of individual memory banks 11 and/or memory bank groups of the DRAM device (e.g., $REF_{sb}$ command) according to an even phase and/or an odd phase. It is noted that, as described herein, the memory controller 17 may provide command signals to the memory device 10 to operate the memory device 10 into the FGR mode, to command the memory device 10 a memory operation to perform, to operate the memory device 10 out of the FGR mode, or the like. In this way, the memory device 10 may receive these command signals from the memory controller 17 and generate internal operational signals based on the command signals from the memory controller 17, such as via the command decoder 32. Thus, when described herein as the memory device 10 extending or altering the FGR mode instructed by the memory controller 17 and/or performing operations in response to commands from the memory controller 17, it should be understood to mean that hardware and/or software of the memory device 10, such as the command decoder 32, are interpreting and/or providing control signals in response to signals received from the memory controller 17.

Figure 6:
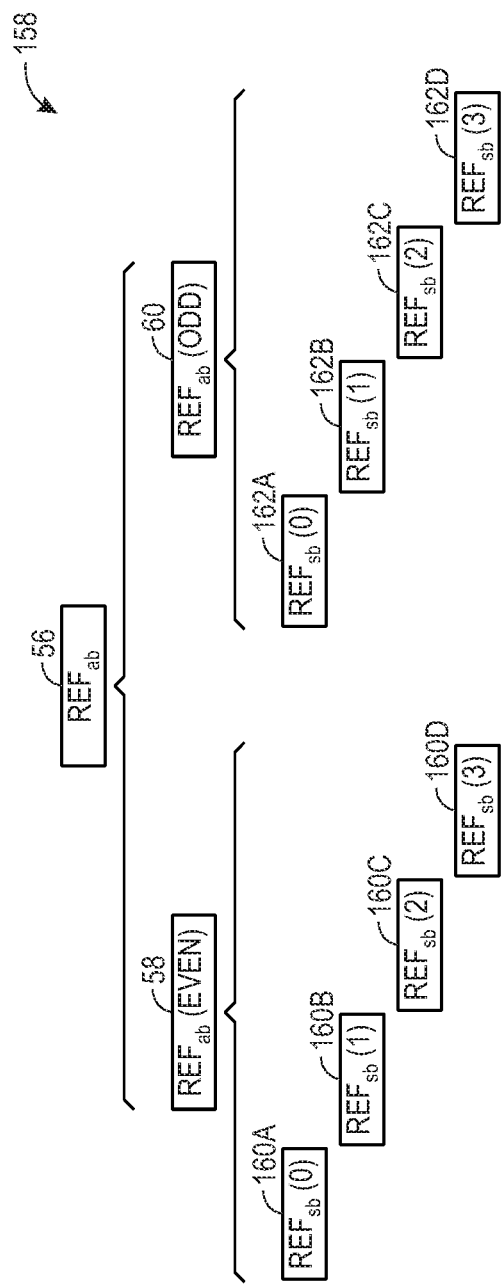
FIG. 6 is an illustration of memory commands with varying granularities available for use by the memory device of FIG. 1 when performing a refresh operation, according to an embodiment of the present disclosure.

To help elaborate, FIG. 6 is an illustration 158 depicting the increasing granularity of memory commands available for use by the memory controller 17 to perform refreshing operations. As described earlier, the $REF_{ab}$ command 56 may be substantially similar or equal to performing two commands in an FGR mode, the $REF_{ab}$(Odd) command 60 and the $REF_{ab}$(Even) command 58. In this way, to maintain a same refresh rate, twice as many number of refresh commands may be issued as $REF_{ab}$(Odd) commands 60 and/or $REF_{ab}$(Even) commands 58 in a 2× mode as issued as $REF_{ab}$ commands 56 in an 1× mode. The memory controller 17 may generate two sets of the $REF_{sb}$ commands 160 while in the FGR mode as opposed to generating the $REF_{ab}$ command 56 in a non-FGR mode. Similarly, the $REF_{ab}$(Odd) command 60 and/or the $REF_{ab}$(Even) command 58 may be replaced by even granular commands 160 (160A, 160B, 160C, 160D) and/or odd granular commands 162 (162A, 162B, 162C, 162D). The granular commands 160, 162 may be used by the memory controller 17 to refresh portions of memory, such as one or more of the memory banks 12, 13. Although flexibility of operation may increase when the memory controller 17 operates in the FGR mode, sometimes the memory controller 17 may exit the FGR mode before each memory bank 11 is refreshed (e.g., such that a full $REF_{ab}$ command 56 is performed).

To elaborate, FIG. 7 is a timing diagram 174 of an example refresh command schedule. The memory controller 17 may perform some of the refresh operations while in the FGR mode and some of the refresh operations while not in the FGR mode (e.g., while in a normal mode). For purposes of discussion, it is presumed that the memory controller 17 refreshes each of the memory banks in an even phase using even phase refresh control signals and each of the memory banks in a subsequent odd phase using odd phase refresh control signals. It should be understood that in some cases, the memory controller 17 may refresh portions of memory banks, such as the even memory banks 12 and the odd memory banks 13, at least partially in parallel and/or sequentially. Furthermore, it should be understood that the odd phase refresh operations, in some cases, may be performed before the even phase refresh operations.

An amount of time the memory controller 17 spends operating in the FGR mode may correspond to a logical high command signal (e.g., duration 176) of the illustration 174. In some examples, the memory controller 17 may operate in the FGR mode in response to managing a duration 176 that corresponds to a programmed or determined operational period during which the memory controller 17 is to operate in the FGR mode. An FGR mode signal may be used to control one or more operations of components used to perform the refresh operations to toggle components in or out of operational modes, and thus may correspond to the duration 176.

While in the FGR mode, the memory controller 17 may perform a first refresh operation on some of the memory banks 11 (e.g., the $REF_{ab}$(Odd) command 60 or the $REF_{ab}$(Even) command 58) and then may perform a second refresh operation on the remaining memory banks 11 (e.g., the other of the $REF_{ab}$(Odd) command 60 or the $REF_{ab}$(Even) command 58). Since each memory bank 11 were refreshed via an even phase refresh and an odd phase refresh, the memory controller 17 may return to the refresh command schedule (e.g., non-FGR mode) without any additional considerations.

However, this may not be the case when the memory controller 17 exits the FGR mode before performing a complete number of refresh operations for a particular phase to each of the memory banks 11. For example, FIG. 8 is a timing diagram 188 of a second example refresh command schedule. In this second example, the memory controller 17 may exit the FGR mode after refreshing the memory banks 11 in the even phase (e.g., $REF_{ab}$(Even) command 58) and before refreshing each of the memory banks 11 in the odd phase. As described above, some memory operations may be desired to be performed on memory bank evenly or symmetrically. Thus, exiting early from an FGR mode may cause refreshes across memory banks to be uneven (e.g., some memory banks were partially refreshed). For example, some refresh operations may be considered incomplete if the memory bank 12A is refreshed without also refreshing the memory bank 13A. To compensate for this early exit from the FGR mode, the memory controller 17 may refresh all memory banks 11 again (e.g., $REF_{ab}$ command 56 indicated by arrow 190) in the even phase and in the odd phase before continuing to perform according to the refresh command schedule (e.g., $REF_{ab}$ command 56 indicated by arrow 192).

Since the memory banks 11 were refreshed in the even phase before the memory controller 17 exited from the FGR mode, it may be redundant to refresh all of the memory banks 11 to compensate for the memory banks 11 not being refreshed in the odd phase. Redundant refresh operations may increase power consumption of the memory device 10. Thus, power consumption of the memory device 10 may be reduced if the memory controller 17 refreshes the memory banks 11 in the odd phase without refreshing the refreshing memory banks 11 in the even phase when the memory controller 17 exits the FGR mode before completing an even number of refresh operations in the odd phase and/or before completing the refreshing of each memory bank 11 in the odd phase.

Figure 9:
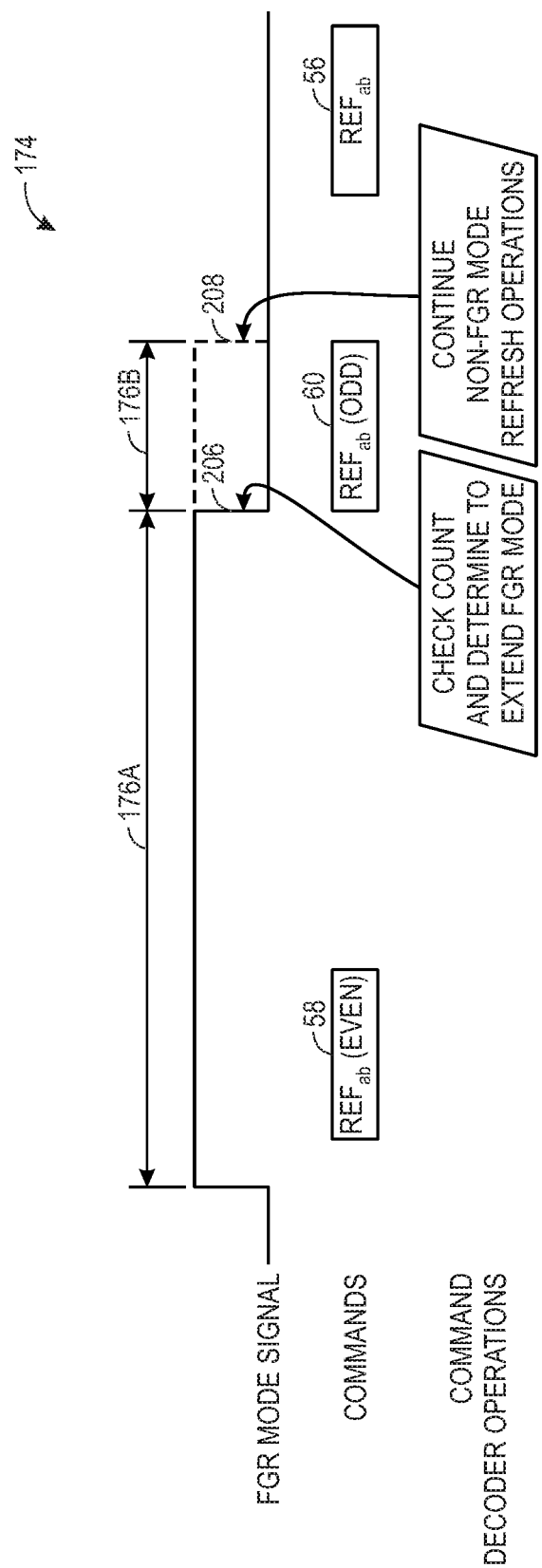
FIG. 9 is a timing diagram of a third example refresh command schedule followed by the memory device of FIG. 1, according to an embodiment of the present disclosure.

To do so, the memory device 10 may internally extend a duration (e.g., duration 176) of the FGR mode in response to determining that an early exit from the FGR mode is requested. For example, FIG. 9 is a timing diagram 174 of a second example refresh command schedule. In this second example, the memory device 10 may receive a request that may instruct an exit and/or determine to exit from the FGR mode at time 206. However, the memory device 10 may determine to extend the FGR mode having a duration 176A by a duration 176B to permit a completion of an odd phase memory bank refresh operation (e.g., the $REF_{ab}$(Odd) command 60) after refreshing the memory banks 11 in the even phase and before refreshing the memory banks 11 in the odd phase.

In some cases, the memory device 10 may determine to extend the FGR mode based on maintained refresh counts, such as refresh counts for each of memory banks 11 or portions of the memory banks 11 (e.g., even memory bank 12 refresh counts stored in even bank refresh counter 52, odd memory banks 13 refresh counts stored in odd bank refresh counter 54). In these cases, a refresh count associated with a number of accesses of memory banks 11 may be adjusted (e.g., incremented, decremented) in response to the memory bank 11 being accessed for a refresh operation and compared, when determining to exit the FGR mode, to determine if the counts are equal or are not equal. The memory device 10 may determine that memory banks 11 were unequally accessed by comparing the counts and determining if the counts represent an even number and/or equal number of accesses. Thus, the counts may represent a historical record of accesses for the memory banks 11. To increase granularity of tracking of accesses to memory banks 11, the memory device 10 may maintain additional counts maintained that correspond to various sizes of groups of memory banks 11. For example, counts may be maintained for each memory bank 11, for the even memory banks 12 and/or the odd memory banks 13, for subsets of even memory banks 12 and/or odd memory banks 13, or the like. The memory device 10 may track any number of memory banks 11 to monitor equal or evenly distributed accesses (e.g., refreshes).

When operating to extend the FGR mode in response to determining that an additional refresh operation is to be performed on the memory banks 11, the memory device 10 may reduce or eliminate a likelihood of repeat refresh operations associated with performing a $REF_{ab}$ command 56 at early exit from the FGR mode (e.g., an exit before each memory bank 11 is refreshed, exit before an even number of memory banks 11 are refreshed). The memory device 10 may reduce power consumed by the memory device 10 when operating in this way since extending the FGR mode and finishing refresh operations of at least some memory banks 11 may reduce a number of redundant refresh operations performed.

Figure 10:
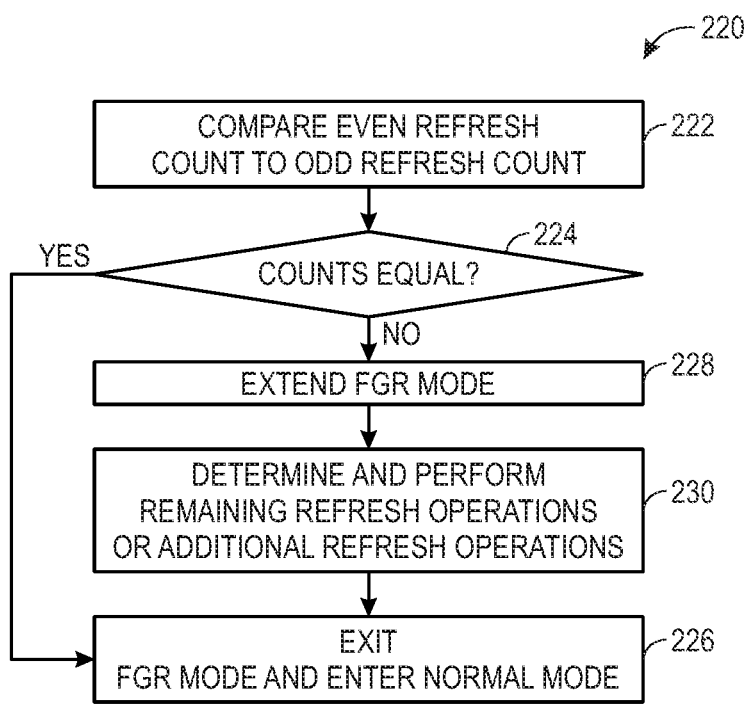
FIG. 10 is a flow diagram of a method for managing an exit from a fine granularity refresh mode (FGR mode) of the memory device of FIG. 1, according to an embodiment of the present disclosure.

To elaborate on operations of the memory device 10 that may reduce power consumed during refresh operations, FIG. 10 is a flow diagram of an example method 220 for managing an exit from an FGR mode. The method 220 may be performed by one or more suitable devices that manage and/or refresh the memory banks 11. While the method 220 is described using operations in a specific sequence, it should be understood that the present disclosure contemplates that the described operations may be performed in different sequences than the sequence illustrated, and certain described operations may be skipped or not performed altogether. In some embodiments, at least some of the operations of the method 220 may be performed by the memory device 10, as described below. However, it is noted that in some cases, other suitable processing circuitry may perform some or all of the operations described below.

The memory device 10 may compare a first refresh count (e.g., even refresh count) and a second refresh count (e.g., odd refresh count) in response to an instruction or determination to exit the FGR mode (process block 222). The memory device 10 may use the comparison to determine whether the first refresh count equals or is substantially similar to the second access count (decision block 224). When the refresh counts are equal or substantially similar, the memory device 10 may proceed to exit the FGR mode and enter a normal mode of operation (process block 226) in response to instruction from the memory controller 17. In the normal mode of operation, the memory controller 17 may refresh memory banks 11 using the $REF_{ab}$ command 56 according to a refresh command schedule. The refresh command schedule may define the durations of time the memory device 10 is to operate in the FGR mode and/or a non-FGR mode or normal mode.

However, when the memory device 10 determines that the refresh counts are not equal or not substantially similar, the memory device 10 may extend the FGR mode and continue to operate in the FGR mode (process block 228). While operating in the FGR mode, the memory device 10 may be able to refresh a portion of the memory banks 11. As such, while in the FGR mode, the memory device 10 may perform refresh operations to make the refresh counts equal, an even number, and/or substantially similar.

To do so, the memory device 10 may determine and perform any remaining refresh operations or additional refresh operations (process block 230). As such, the memory device 10 may selectively refresh the portion of the memory banks 11 corresponding to the lesser of the two refresh counts. For example, when the first refresh count is less than the second refresh count, the memory device 10 may refresh the portion of the memory banks 11 that corresponds to the first refresh count.

The memory device 10 may continue to perform refresh operations until the refresh counts are suitably adjusted (e.g., made into an even number or made suitably more equal). When the memory device 10 completes refresh operations in the extended FGR mode, the memory device 10 may proceed to exit the FGR mode and enter a normal mode of operation (process block 226).

As described above, the portions of the memory banks 11 refreshed by the memory controller 17 in the FGR mode may vary by particular application and/or by particular memory device 10. In this way, it may sometimes be desired to refresh individual memory banks 11 rather than groups of memory banks 11 (e.g., a group of even memory banks 12, a group of odd memory banks 13), where the individual memory banks 11 may represent a relatively smaller granularity of refresh operation than used to instruct a refresh of each memory bank 11 (e.g., $REF_{ab}$ command 56).

Figure 11:
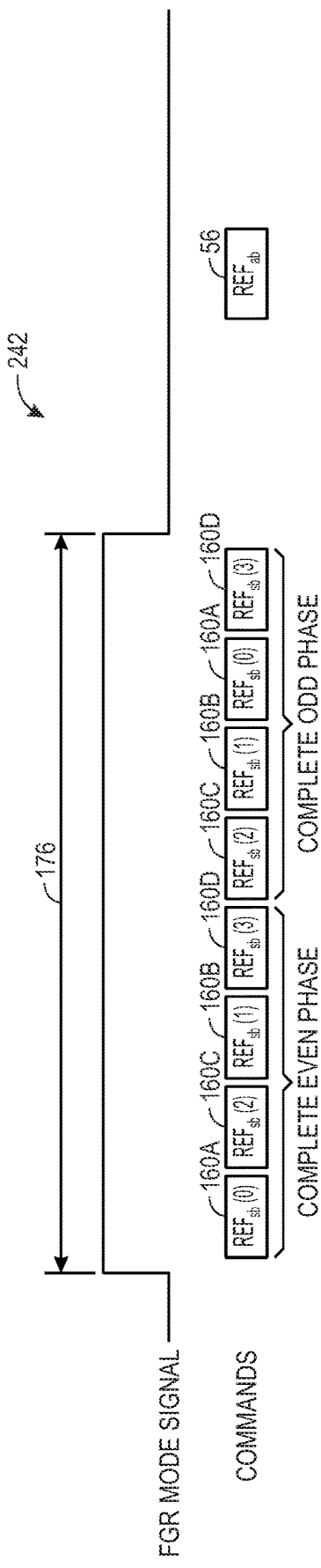
FIG. 11 is a timing diagram of a fourth example refresh command schedule followed by the memory device of FIG. 1, according to an embodiment of the present disclosure.

To elaborate, FIG. 11 is a timing diagram 242 of a fourth example refresh command schedule. As described above, the memory device 10 may operate in the FGR mode for the duration 176 corresponding to a logical high command signal (e.g., FGR mode signal). While in the FGR mode, the memory controller 17 may perform refresh operations on individual memory banks 11 (e.g., one or more memory banks 11 to be refreshed via a $REF_{sb}(0)$ command corresponding to granular command 160A, one or more memory banks 11 to be refreshed via a $REF_{sb}(1)$ command corresponding to granular command 160B, one or more memory banks 11 to be refreshed via a $REF_{sb}(2)$ command corresponding to granular command 160C, one or more memory banks 11 to be refreshed via a $REF_{sb}(3)$ command corresponding to granular command 160D).

In this example, the granular command 160A is performed first but it should be understood that any order may be used for refreshing of memory banks 11 when using granular commands 160, 162. Since each of the memory banks 11 were refreshed in the odd phase (e.g., "complete odd phase") and in the even phase (e.g., "complete even phase"), the memory device 10 may return to following the refresh command schedule without any additional considerations. The return to the refresh command schedule may occur with the memory device 10 performing a refresh on all memory banks 11 (e.g., performing the $REF_{ab}$ command 56 that includes performing even phase refresh operations and odd phase refresh operations).

Figure 12:
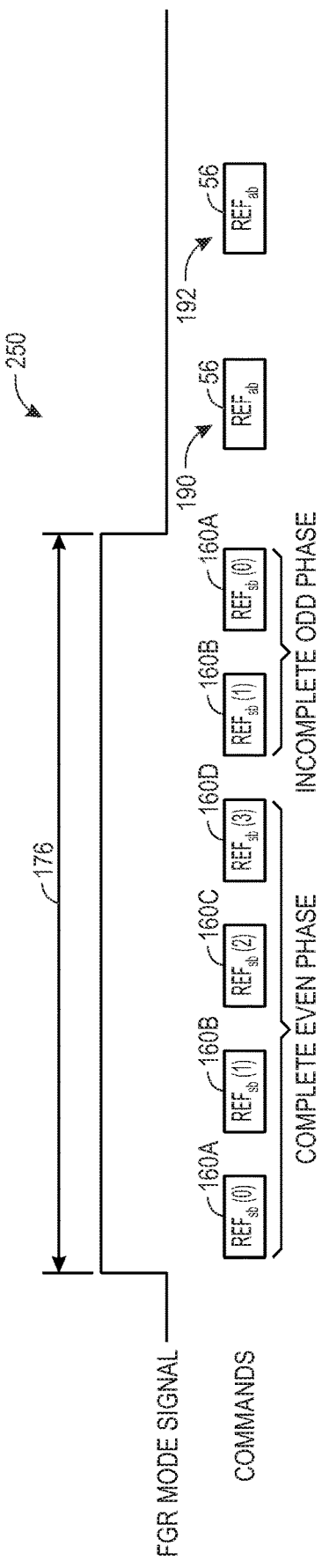
FIG. 12 is a timing diagram of a fifth example refresh command schedule followed by the memory device of FIG. 1, according to an embodiment of the present disclosure.

Similar to FIG. 8, sometimes the memory controller 17 may exit the FGR mode before refreshing each of the memory banks 11 in the odd phase and/or the even phase. For example, FIG. 12 is a timing diagram 250 of a fifth example refresh command schedule where the memory controller 17 exits the FGR mode before performing an even number of refresh operations (e.g., represented by "incomplete odd phase"). In this second example, the memory controller 17 may exit the FGR mode after refreshing the memory banks 11 according to the even phase (e.g., "complete even phase") and before refreshing each of the memory banks 11 according to the odd phase (e.g., "incomplete odd phase"). To compensate for this early exit from the FGR mode, the memory device 10 may refresh each of the memory banks 11 again (e.g., $REF_{ab}$ command 56 indicated by arrow 190) before continuing to perform according to the refresh command schedule (e.g., $REF_{ab}$ command 56 indicated by arrow 192).

It is noted that in some cases, refresh operations may be desired to be symmetric, and thus, for example, when memory banks 11 are refreshed in the even phase without refreshing each of the memory banks 11 in the odd phase, the refresh operation is considered to be an "incomplete odd phase" and may trigger additional refresh operations to refresh the missing memory banks 11. Similar to operations described with FIG. 12, refreshing each of the memory banks 11 to compensate for a few missing refresh operations may consume additional power.

Figure 13:
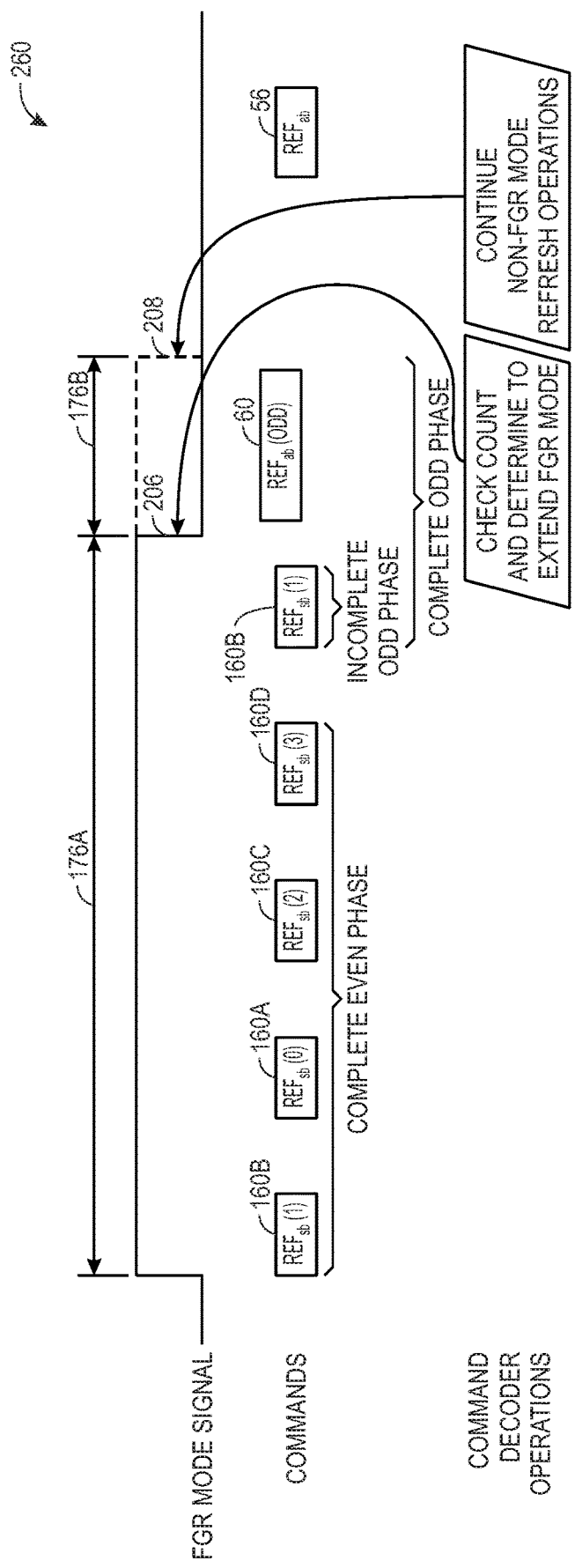
FIG. 13 is a timing diagram of a sixth example refresh command schedule followed by the memory device of FIG. 1, according to an embodiment of the present disclosure.

To reduce power consumed, the memory device 10 may refresh memory banks 11 corresponding to any missing refresh operations (e.g., determined at process block 230). For example, FIG. 13 is a timing diagram 260 of a sixth example refresh command schedule. In this second example, the memory device 10 may receive a request that may instruct an exit from the FGR mode at time 206. However, the memory device 10 may determine to extend the FGR mode having a duration 176A by a duration 176B to permit a completion of remaining refresh operations (e.g., $REF_{sb}$(O) command, $REF_{sb}(2)$ command, $REF_{sb}(3)$ command) using $REF_{ab}$(odd). The memory device 10 may determine to extend the FGR mode by comparing refresh counts, as described above with respect to FIG. 10 (e.g., decision block 224). While operating in the extended FGR mode, the memory device 10 may perform refresh operations determined to be remaining refresh operations. Thus, at exit from the FGR mode (e.g., at time 208), the total of the refresh operations may form a "complete even phase" group of refresh commands and a "complete odd phase" group of refresh commands. Once the memory device 10 exits the FGR mode, the memory device 10 may perform the $REF_{ab}$ command 56 in accordance with a refresh command schedule used for the normal mode (e.g., non-FGR mode).

Figure 14:
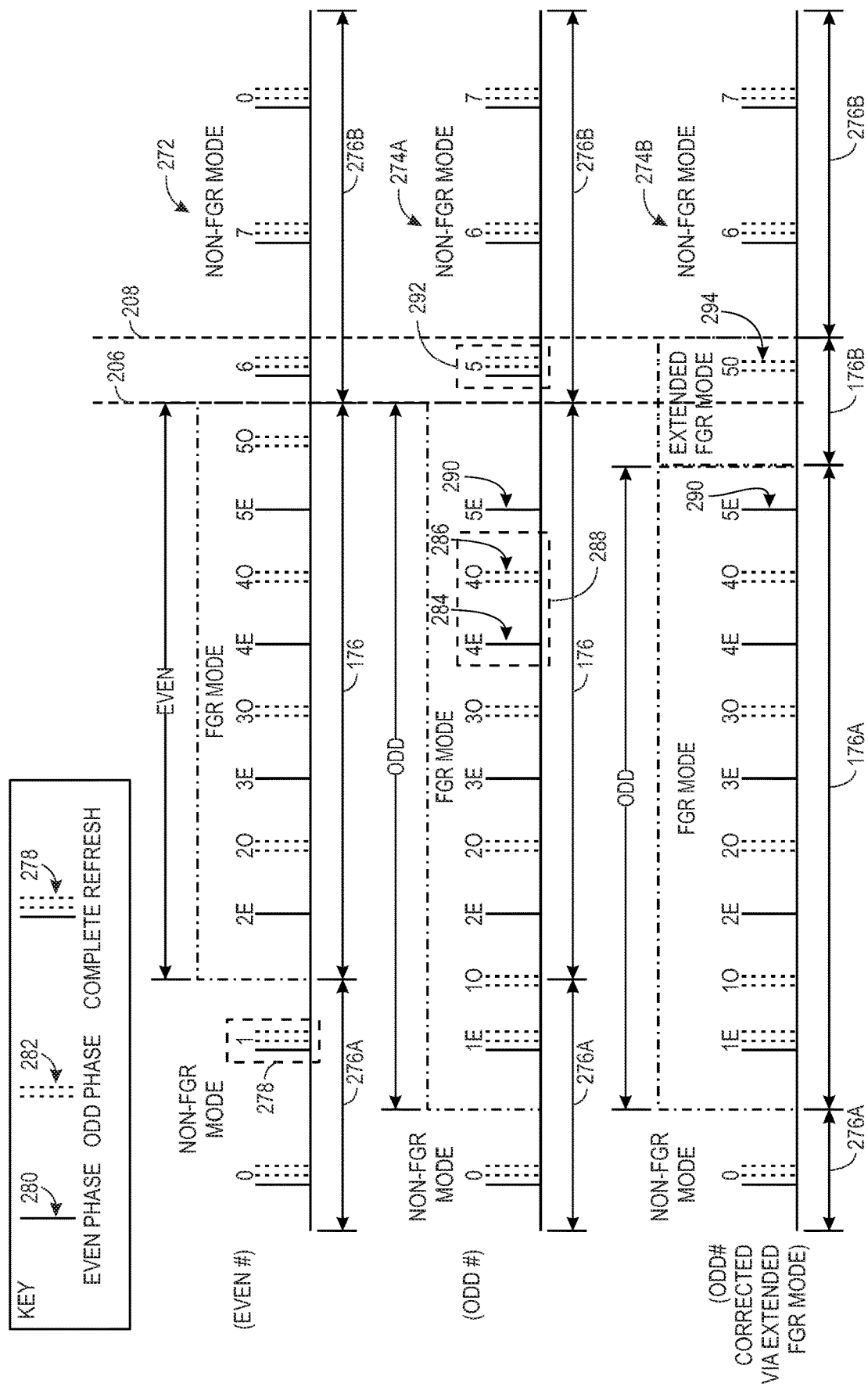
FIG. 14 is a timing diagram comparing refresh command schedules, according to an embodiment of the present disclosure.
Figure 15:
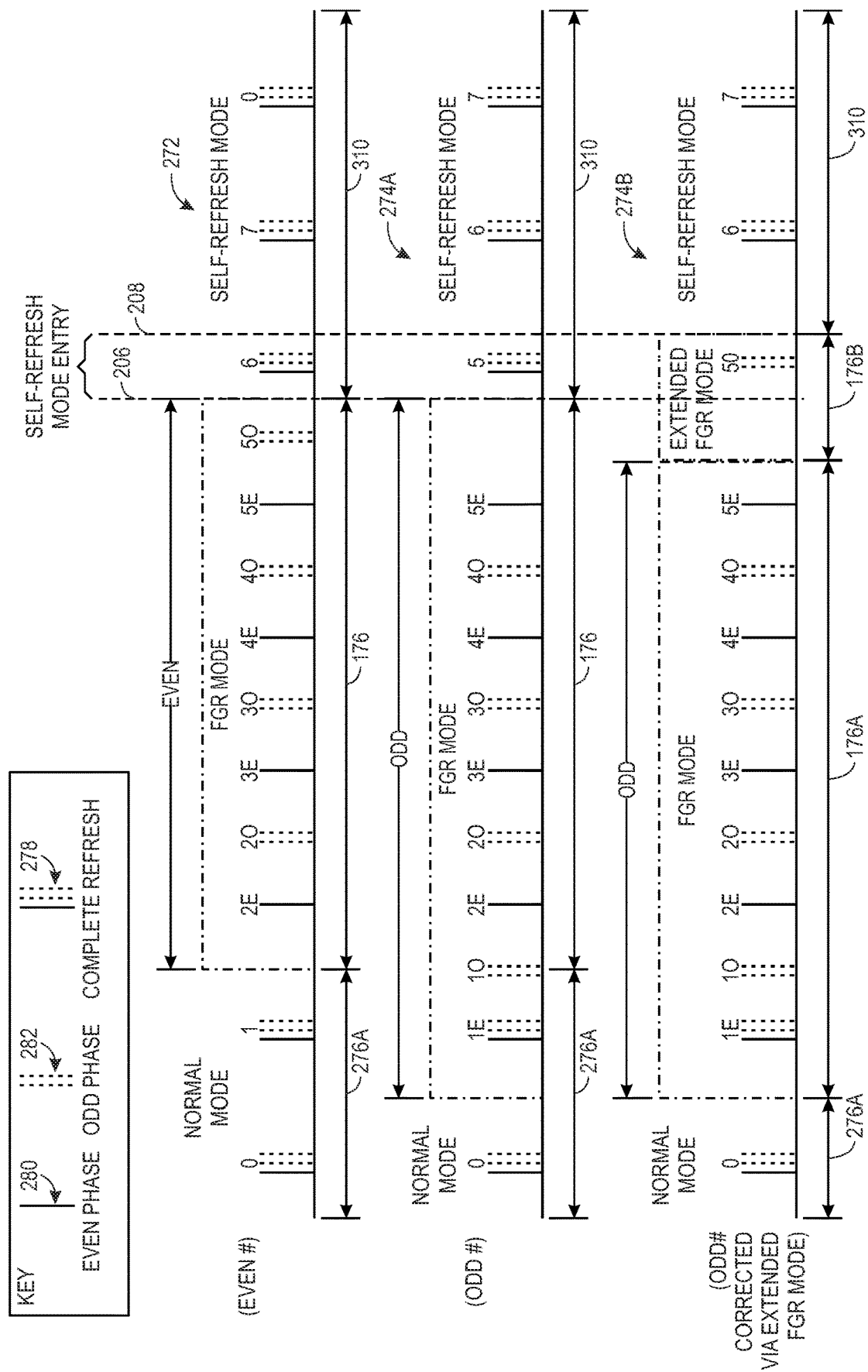
FIG. 15 is a timing diagram comparing the refresh command schedules of FIG. 14 and showing the memory device of FIG. 1 entering an FGR mode from a normal mode and entering a self-refresh mode from the FGR mode, according to an embodiment of the present disclosure.

FIG. 14 and FIG. 15 are illustrations comparing refresh command schedules. In this way, FIG. 14 is a timing diagram comparing a refresh command schedules and FIG. 15 is a timing diagram that compares the refresh command schedules of FIG. 14 and shows the memory device 10 entering a fine granularity refresh mode (FGR mode) from a normal mode (e.g., non-FGR mode) or enter a self-refresh mode from the FGR mode. A first schedule 272 may correspond to a first operation of the memory device 10 that may result in each memory bank 11 being refreshed in the even phase. A second schedule 274 may correspond to a second operation of the memory device 10 that may result in a non-even number of memory banks 11 being refreshed in the odd phase. A first option of the second schedule 274A may show a first operation to handle the odd number of refreshes while a second option of the second schedule 274B may show a second operation to handle the odd number of refreshes. The first option of the second schedule 274A may generally correspond to descriptions of FIG. 8 and FIG. 12 and/or the second option of the second schedule 274B may generally correspond to descriptions of FIG. 9 and FIG. 13.

The first schedule 272 shows a duration 276A and a duration 276B that both correspond to the memory device 10 operating in the normal mode. The first schedule 272 also shows the duration 176 that corresponds to the memory device 10 operating in the FGR mode. A complete refresh operation may correspond to group 278. The complete memory pair refresh may include a refresh of each memory bank 11 according to the even phase (e.g., corresponding to arrow 280) and a refresh of each memory bank 11 according to the odd phase (e.g., corresponding to arrow 282). While the memory device 10 operates in the normal mode and follows the first schedule 272, the memory device 10 may refresh memory banks 11 at a substantially simultaneous time such that no memory banks 11 are accessible for activation operations (e.g., for use in a read or write operation). While operating in the FGR mode, the memory device 10 may refresh memory banks 11 such that non-refreshing memory banks 11 are accessible (e.g., when $REF_{sb}$ is used). The first schedule 272 may cause the memory device 10 to refresh the memory banks an equal number of times in each of the even phase and odd phase. Thus, when the memory device 10 exits the FGR mode (e.g., at time 206), the memory device 10 may return to normal refresh operation where complete refresh commands are issued (e.g., $REF_{ab}$).

The second schedules 274 may both involve an incomplete memory refresh where an unsuitable number of even phase refreshes and/or odd phase refreshes are performed (e.g., such that a total number of refreshes are equal or even). For example, an even phase refresh corresponding to a fourth subset of memory banks 11 (e.g., arrow 284) corresponds to an odd phase refresh corresponding to the fourth subset of memory banks 11 (e.g., arrow 286), making a complete refresh. However, an incomplete refresh may result from, for example, a fifth subset of memory banks 11 being refreshed in an even phase (e.g., arrow 290) without also refreshing the fifth subset of memory banks 11 in the odd phase during the FGR mode.

To compensate for the odd phase refresh 13 being skipped at exit from the FGR mode, the memory device 10 may perform an even phase and odd phase refresh of the fifth subset of memory banks 11 (e.g., arrow 292) after exiting the FGR mode at time 206. However, refreshing as depicted as the first option of the second schedule 274A may repeat the even phase refresh of the fifth subset of memory banks 11 since the refresh operations may affect the same word lines of the particular memory banks 11. Thus, the even phase refresh operation of the fifth subset of memory banks 11 may be considered redundant. These redundant operations may also consume additional power.

Extending the FGR mode to refresh fifth subset of memory banks 11 according to the odd phase may reduce power consumed by the memory device 10 relative to power consumed when operating according to the second schedule 274A. When the memory device 10 operates according to the second schedule 274B, the memory device 10 may operate in a normal mode for durations 276A and 276B and may operate in the FGR mode for the original duration 176A and for the extended duration 176B. The memory device 10 may follow operations of method 220 to determine when to extend the FGR mode to include the duration 176B. During the duration 176B, the memory device 10 may perform the remaining refresh operations to complete refreshing of the memory banks 11 without performing redundant refresh operations and/or while performing a relatively fewer number of redundant refresh operations (e.g., performing a $REF_{ab}$(odd) command 60). For example, the memory device 10 may refresh the fifth subset of memory banks 11 according to the odd phase (e.g., arrow 294) without additionally refreshing the fifth subset of memory banks 11 according to the even phase (e.g., arrow 292). Operating according to the second schedule 274B may improve operation of the memory device 10 by reducing power consumed by the memory device 10.

In some cases, the memory device 10 may operate according to a self-refresh mode (e.g., a third operational mode, a non-FGR mode) as opposed to returning to the normal mode at exit from the FGR mode. FIG. 15 depicts the same refresh command schedules as FIG. 14, the difference being that in FIG. 15, the refresh command schedules include the self-refresh mode and/or the third operational mode. Discussions from above may be relied upon for FIG. 15. It is noted that the command decoder, after exiting the FGR mode, may enter any suitable operational mode (e.g., a third operational mode, such as the self-refresh operational mode). In this example, when the memory device 10 exits the FGR mode, the memory device 10 may enter the self-refresh mode corresponding to a duration 310. The self-refresh mode may correspond to an operational state of the memory device 10 that is a pseudo-static operation, where operation of the memory device 10 may be temporarily suspended to reduce power consumed but maintain integrity of data stored in the memory banks 11.

Accordingly, the technical effects of the present disclosure include systems and methods that improve memory refresh operations. Control circuitry of the memory device (e.g., DRAM device) may determine whether a number of refreshes for the memory device is an even number or equal between memory banks in response to receiving a command to exit the FGR mode. When the number of memory banks refreshed is uneven (e.g., an odd number, unequal), the memory device may remain in the FGR mode while remaining memory banks are refreshed. Extending the FGR mode may decrease power consumed during refresh operations since redundant refresh operations may be reduced.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a first memory bank;
a second memory bank; and
control circuitry configured to:
refresh the first memory bank;
determine, at a current time, that the second memory bank was not refreshed within a threshold time duration from the current time;
extend a duration of an operational mode in response to determining that the second memory bank was not refreshed within the threshold time duration; and
in response to extending the duration of the operational mode, refresh the second memory bank without refreshing the first memory bank.

2. The device of claim 1, comprising a plurality of memory banks that include the first memory bank and the second memory bank, wherein the control circuitry is configured to refresh the plurality of memory banks while operating in the operational mode.

3. The device of claim 1, comprising a plurality of memory banks, wherein the control circuitry is configured to operate in the operational mode, and wherein the control circuitry is configured to refresh the plurality of memory banks one memory bank at a time while operating in the operational mode.

4. The device of claim 1, wherein the control circuitry is configured to determine, in response to receiving an instruction to exit the operational mode, that the second memory bank was not refreshed.

5. The device of claim 1, wherein the operational mode comprises a fine granularity refresh mode.

6. The device of claim 1, wherein the second memory bank is associated with a first subset of a plurality of memory banks and the first memory bank is associated with a second subset of the plurality of memory banks.

7. The device of claim 1, wherein the first memory bank and the second memory bank are refreshed as part of an odd phase refresh operation or as part of an even phase refresh operation.

8. The device of claim 1, wherein the control circuitry is configured to determine that the second memory bank was not refreshed within the threshold time duration from the current time based at least in part on a comparison of refresh counts.

9. The device of claim 1, comprising a plurality of memory banks comprising a first subset of memory banks and a second subset of memory banks, wherein the first subset of memory banks includes the first memory bank, wherein the second subset of memory banks includes the second memory bank, and wherein the control circuitry is configured to:
   determine that the first subset of memory banks was refreshed by a first amount of counts;
   determine that the second subset of memory banks were refreshed by a second amount of count;
   determine that the second amount is less than the first amount; and
   determine to refresh one or more memory banks of the second subset of memory banks yet to be refreshed.

10. The device of claim 9, wherein an even bank refresh counter tracks a number of times that respective banks of the first subset of memory banks were refreshed, and wherein an odd bank refresh counter tracks a number of times that respective banks of the second subset of memory banks were refreshed.

11. A method of operating control circuitry, comprising:
   receiving, at a first time, an instruction to exit an operational mode of the control circuitry;
   determining, at the first time, that the control circuitry refreshed a first memory bank without refreshing a second memory bank;
   extending a duration of the operational mode of the control circuitry beyond the first time in response to determining that the control circuitry refreshed the first memory bank without refreshing the second memory bank; and
   in response to extending the duration of the operational mode, refreshing the second memory bank without refreshing the first memory bank while the control circuitry is in the operational mode.

12. The method of claim 11, wherein determining that the control circuitry refreshed the first memory bank without refreshing the second memory bank comprises:
   comparing a first refresh count to a second refresh count; and
   determining that the second refresh count is less than the first refresh count.

13. The method of claim 11, comprising:
   entering the operational mode as a first operational mode from a second operational mode, wherein the first operational mode is the operational mode;
   in response to refreshing the second memory bank while in the first operational mode, exiting the first operational mode and entering a third operational mode; and
   while in the third operational mode, refreshing the first memory bank and the second memory bank.

14. The method of claim 11, wherein determining that the control circuitry refreshed the first memory bank without refreshing the second memory bank comprises determining that a refresh count is an odd number.

15. The method of claim 11, comprising:
   determining, at the first time, that the control circuitry refreshed the first memory bank without refreshing a third memory bank; and
   extending the duration of the operational mode of the control circuitry in response to determining that the control circuitry refreshed the first memory bank without refreshing the third memory bank, wherein the duration of the operational mode is extended to a duration equal to an amount of time to be used to refresh the second memory bank and the third memory bank.

16. A device, comprising:
a processor; and
a memory, storing instructions that, when executed by the processor, cause the processor to perform operations comprising:
   receiving, at a first time, an instruction to cause the processor to exit an operational mode;
   determining, at the first time, that a first portion of the memory was refreshed without refreshing a second portion of the memory;
   extending a duration of the operational mode in response to determining that the first portion of the memory was refreshed without refreshing the second portion of the memory; and
   in response to extending the duration of the operational mode, refreshing the second portion of the memory without refreshing the first portion of the memory while the control circuitry is in the operational mode.

17. The device of claim 16, comprising:
a plurality of memory banks, wherein a first subset of the plurality of memory banks comprises the first portion of the memory and a second subset of the plurality of memory banks comprises the second portion of the memory.

18. The device of claim 17, wherein the instructions for determining that the first portion of the memory was refreshed without refreshing a second portion of the memory include instructions to cause the processor to perform operations comprising:
   determining a first refresh count of the first subset of the plurality of memory banks;
   determining a second refresh count of the second subset of the plurality of memory banks; and
   determining that the second refresh count is less than the first refresh count.

19. The device of claim 17, wherein the instructions for determining that the first portion of the memory was refreshed without refreshing a second portion of the memory include instructions to cause the processor to perform operations comprising:
   determining a total refresh count of the memory banks is characterized as an odd number; and
   determining that the second portion of memory was not refreshed in response to the total refresh count being characterized as the odd number.

20. The device of claim 16, wherein the operational mode comprises a fine granularity refresh mode, wherein the processor is configured to refresh individual banks of the memory while in the fine granularity refresh mode, and wherein the processor is configured to refresh pairs of banks of the memory while not in the fine granularity refresh mode.

* * * * *